United States Patent
Subramaniyan et al.

(10) Patent No.: US 11,079,738 B2
(45) Date of Patent: Aug. 3, 2021

(54) FRAMEWORK FOR RAPID ADDITIVE DESIGN WITH GENERATIVE TECHNIQUES

(71) Applicant: General Electric Company, Schenectady, NY (US)

(72) Inventors: Arun Karthi Subramaniyan, Niskayuna, NY (US); Ananda Barua, Schenectady, NY (US); Daniel Erno, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 822 days.

(21) Appl. No.: 15/678,653

(22) Filed: Aug. 16, 2017

(65) Prior Publication Data

US 2019/0056715 A1 Feb. 21, 2019

(51) Int. Cl.
*G05B 19/4099* (2006.01)
*G06N 3/04* (2006.01)
(Continued)

(52) U.S. Cl.
CPC ......... *G05B 19/4099* (2013.01); *G06F 30/17* (2020.01); *G06N 3/04* (2013.01);
(Continued)

(58) Field of Classification Search
USPC .......................................................... 706/16
See application file for complete search history.

(56) References Cited

U.S. PATENT DOCUMENTS 10,262,127 B2 * 4/2019 Subramaniyan ........ G06F 21/64
10,296,296 B2 * 5/2019 Subramaniyan .......... G06F 8/35
(Continued)

FOREIGN PATENT DOCUMENTS

CN 104385606 A 3/2015
CN 103567442 B 6/2015
(Continued)

OTHER PUBLICATIONS

Loy, Jennifer, "Supporting creative learning for rapid prototyping and additive manufacturing through lessons from creative learning for CNC routering and laser cutting technologies", NZ Rapid Product Development Conference 2011 Proceedings, 2011, Auckland, New Zealand, (pp. 1-6, 6 total pages).
(Continued)

*Primary Examiner* — Michael B Holmes
(74) *Attorney, Agent, or Firm* — Dority & Manning, P.A.

(57) ABSTRACT

According to some embodiments, a system may include a design experience data store containing electronic records associated with prior industrial asset item designs. A deep learning model platform, coupled to the design experience data store, may include a communication port to receive constraint and load information from a designer device. The deep learning platform may further include a computer processor adapted to automatically and generatively create boundaries and geometries, using a deep learning model associated with an additive manufacturing process, for an industrial asset item based on the prior industrial asset item designs and the received constraint and load information. According to some embodiments, the deep learning model computer processor is further to receive design adjustments from the designer device. The received design adjustments might be for example, used to execute an optimization process and/or be fed back to continually re-train the deep learning model.

22 Claims, 20 Drawing Sheets

(51) Int. Cl.
| | |
|---|---|
| *G06N 5/02* | (2006.01) |
| *G06N 3/08* | (2006.01) |
| *G06N 7/00* | (2006.01) |
| *G06N 20/00* | (2019.01) |
| *G06F 30/17* | (2020.01) |
| *B33Y 50/00* | (2015.01) |

(52) U.S. Cl.
CPC ............ *G06N 3/08* (2013.01); *G06N 5/025* (2013.01); *G06N 7/005* (2013.01); *G06N 20/00* (2019.01); *B33Y 50/00* (2014.12); *G05B 2219/49023* (2013.01); *G06N 5/027* (2013.01)

(56) References Cited

U.S. PATENT DOCUMENTS

| | | | | |
|---|---|---|---|---|
| 10,394,770 | B2* | 8/2019 | Asher | G06F 16/215 |
| 10,438,126 | B2* | 10/2019 | Subramaniyan | G06F 17/18 |
| 10,459,774 | B2* | 10/2019 | Subramaniyan | G06F 9/541 |
| 10,481,874 | B2* | 11/2019 | Subramaniyan | G06F 8/34 |
| 10,488,279 | B2* | 11/2019 | Subramaniyan | F01D 21/14 |
| 10,628,145 | B2* | 4/2020 | Subramaniyan | G06F 8/60 |
| 10,633,983 | B2* | 4/2020 | Barua | F01D 5/20 |
| 10,661,552 | B2* | 5/2020 | Barua | B29C 64/153 |
| 10,668,710 | B2* | 6/2020 | Barua | F01N 3/28 |
| 10,688,558 | B2* | 6/2020 | Barua | C04B 35/64 |
| 10,706,189 | B2* | 7/2020 | Wang | G01M 15/14 |
| 10,719,639 | B2* | 7/2020 | Viana | G06N 7/005 |
| 10,781,721 | B2* | 9/2020 | Barua | B29C 64/00 |
| 10,821,485 | B2* | 11/2020 | Barua | B22F 10/70 |
| 10,822,972 | B2* | 11/2020 | Mukherjee | F01D 11/12 |
| 10,832,753 | B2* | 11/2020 | Barua | B33Y 10/00 |
| 10,940,535 | B2* | 3/2021 | Barua | B33Y 10/00 |
| 2014/0214370 | A1 | 7/2014 | Olhofer et al. | |
| 2016/0004794 | A1 | 1/2016 | Reimann et al. | |
| 2016/0239551 | A1 | 8/2016 | Ovsjanikovs et al. | |
| 2016/0318251 | A1 | 11/2016 | Ederer et al. | |
| 2017/0200265 | A1 | 7/2017 | Bhaskar et al. | |
| 2018/0122133 | A1* | 5/2018 | Narayan | G08B 5/22 |
| 2018/0159879 | A1* | 6/2018 | Mestha | G06N 20/00 |
| 2020/0098015 | A1* | 3/2020 | Pai | G06Q 30/0277 |

FOREIGN PATENT DOCUMENTS

| | | |
|---|---|---|
| CN | 103213281 B | 5/2016 |
| CN | 103894611 B | 2/2017 |
| WO | 2012130417 A1 | 10/2012 |
| WO | 2015/087084 A1 | 6/2015 |
| WO | 2016179455 A1 | 11/2016 |

OTHER PUBLICATIONS

Zhou, Yuhaowei "Productivity Assessment model of Binder-Jetting Additive Manufacturing Processes", A thesis submitted to McGill University in partial fulfillment of the requirements of the degree of MSc (Thesis), Jun. 2015, (pp. 1-56, 56 total pages), Part 1.

Zhou, Yuhaowei "Productivity Assessment model of Binder-Jetting Additive Manufacturing Processes", A thesis submitted to McGill University in partial fulfillment of the requirements of the degree of MSc (Thesis), Jun. 2015, (pp. 57-115, 59 total pages), Part 2.

Zhu, Jun-Yan et al. "Generative Visual Manipulation on the Natural Image Manifold", in European Conference on Computer Vision (ECCV), 2016, (pp. 597-613, 16 total pages).

Karpathy, Andrej et al., "Generative Models", Jun. 6, 2016, download from https://blog.openai.com/generative-models/, Retrieved on May 3, 2017, 18pgs.

International Search Report and Written Opinion issued in connection with corresponding PCT Application No. PCT/US2018/041068 dated Oct. 31, 2018.

* cited by examiner

| DESIGN IDENTIFIER 1902 | DESIGNER IDENTIFIER 1904 | ITEM DESCRIPTION 1906 | SELECTED DEEP LEARNING MODEL 1908 | SEED SHAPE 1910 | FINAL DESIGN 1912 | STATUS 1914 |
|---|---|---|---|---|---|---|
| D_101 | JOE@DESIGN.COM | BRACKET | MODEL_101 | IMAGE_1 | PRINT_FILE | PENDING |
| D_102 | DESIGNER_123 | VALVE | MODEL_102 | GEOMETRIES | IMAGE_FINAL | IN PROCESS |
| D_103 | 123.123.123.123 | TURBINE BLADE | MODEL_101 | CAD_101 | CAD_OUT | PRINTED |

FRAMEWORK FOR RAPID ADDITIVE DESIGN WITH GENERATIVE TECHNIQUES

BACKGROUND

Some embodiments disclosed herein relate to industrial assets and, more particularly, to a framework for rapid additive design with generative techniques for the manufacture of industrial asset items.

A designer might want to design an industrial asset item, such as a nozzle for a jet engine, a replacement part for a wind turbine, etc. In some cases, the designer might be creating a design specifically to be produced using an additive manufacturing process (e.g., a three-dimensional printer). Although the additive manufacturing process is "additive" (i.e., material is added continually to build the final item), the typical design process for creating geometries that are to be additively printed is largely reductive. For example, traditional optimization techniques (e.g., topology optimization) that are used in the design process begin with a large block of material and systematically remove portions to arrive at a final "optimal" geometry. Although such an approach worked well when the manufacturing processes were reductive (such as milling), it may significantly limit the interaction that the designer has with the design process. In contrast, additively manufactured parts are beginning to look more like "sculpted" components which require continual interaction by the designer during the design process. Even for traditionally manufactured parts, providing a feedback loop for the designer during a design process might significantly improve the final design (and reduce the design cycle time). Another drawback of traditional design tools is that they are not suited for a rapid exploration of multiple design spaces. Instead, the tools require expert knowledge from multiple disciplines which can make the design process relatively slow. It may therefore be desirable to achieve improved and computerized ways to efficiently and accurately facilitate the design of an industrial asset item

SUMMARY

According to some embodiments, a system may include a design experience data store containing electronic records associated with prior industrial asset item designs. The system may also include a deep learning model platform, coupled to the design experience data store, having a communication port to receive constraint and load information from a designer device. A deep learning model computer processor coupled to the communication port and may be adapted to automatically and generatively create boundaries and geometries, using a deep learning model associated with an additive manufacturing process, for an industrial asset item based on the prior industrial asset item designs and the received constraint and load information.

Some embodiments comprise: means for receiving, at a search platform from a designer device, a search of a generative model repository; means for executing a search of the generative model repository to identify a starting seed shape for the industrial asset item; means for receiving, at a deep learning model platform, the starting seed shape along with constraint and load information from the designer device; means for automatically and generatively creating boundaries and geometries, by the deep learning model platform using a deep learning model associated with an additive manufacturing process, for the industrial asset item based on the prior industrial asset item designs and the received constraint and load information; means for receiving design adjustments at the deep learning model platform from the designer device; means for executing an optimization process based on the received design adjustments, execute an optimization process; means for executing, at a physics model platform, a validation process on at least one intermediate industrial asset design based on received the boundaries and geometries; means for receiving, at an additive manufacturing printer, a final industrial asset design based on the automatically and generatively created boundaries and geometries; and means for creating, by the additive manufacturing printer, the industrial asset item.

Technical effects of some embodiments of the invention are improved and computerized ways to efficiently and accurately facilitate the design of an industrial asset item. With these and other advantages and features that will become hereinafter apparent, a more complete understanding of the nature of the invention can be obtained by referring to the following detailed description and to the drawings appended hereto.

BRIEF DESCRIPTION OF THE DRAWINGS

FIG. 19 is a portion of a tabular generative design database in accordance with some embodiments.

DETAILED DESCRIPTION

In the following detailed description, numerous specific details are set forth in order to provide a thorough understanding of embodiments. However, it will be understood by those of ordinary skill in the art that the embodiments may be practiced without these specific details. In other instances, well-known methods, procedures, components and circuits have not been described in detail so as not to obscure the embodiments.

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
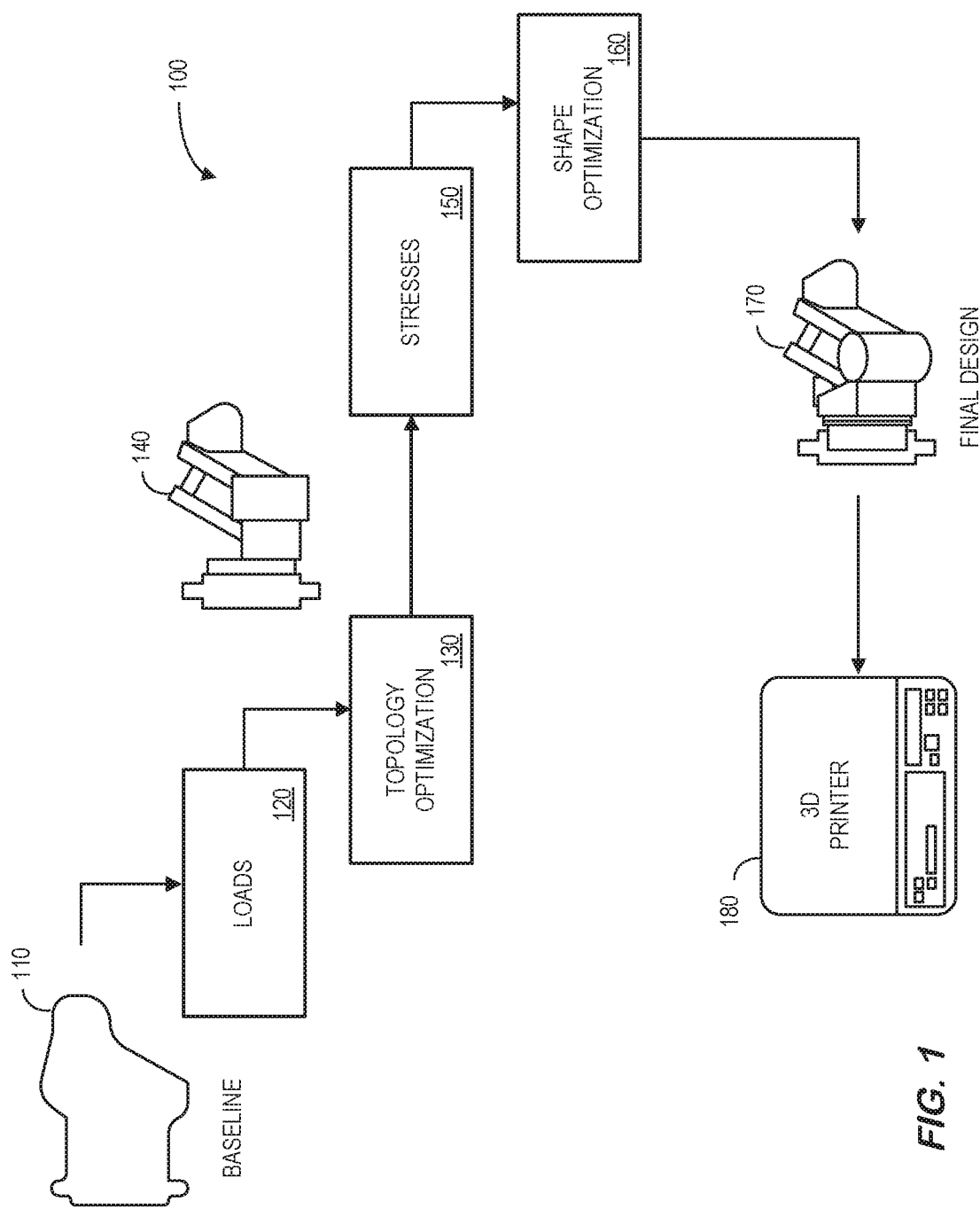
FIG. 1 is an overview of a design process.

FIG. 1 is an overview of a design process 100. The process 100 begins with a baseline design 110 for which a designer can add load information 120. The load information 120 might be associated with, for example, centrifugal loads, bolt loads, etc. along an x-axis, a y-axis, and a z-axis. Topology optimization 130 may then be performed to create an adjusted or refined design 140. The designer can then add stress information 150 (e.g., a maximum principal stress of a particular amount of kilo-pounds per square inch ("ksi")). A shape optimization process 160 may then be performed, and a final design 170 may be provided to a three-dimensional printer 180.

Figure 2:
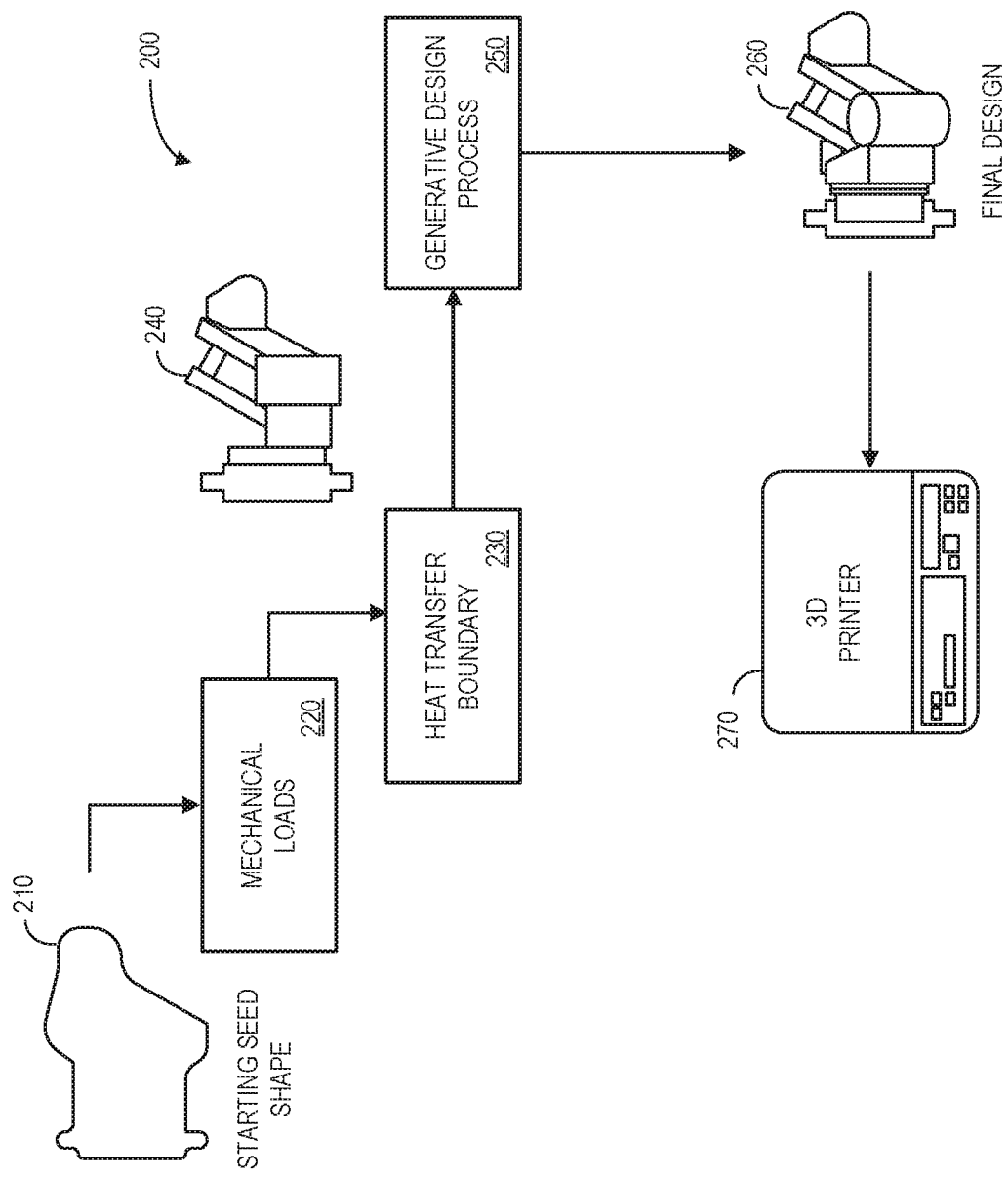
FIG. 2 is an overview of a generative design process according to some embodiments.

Such an approach, however, might be a relatively slow process and may limit the ability of a design to take advantage of prior item designs. It may therefore generally be desirable to efficiently and accurately facilitate design of an industrial asset item. FIG. 2 is an overview of a generative design process 200 according to some embodiments. Initially, a starting seed shape is selected 210 (e.g., either by a designer or an automated process) and mechanical load information 220, heat transfer boundary information 230, etc. may then be provided to a "generative design" process 250. As used herein, the phrase "generative design" may refer to, for example, a form finding process that takes an evolutionary approach to design. The process 250 can start with design goals and then explore innumerable possible permutations (e.g., intermediate designs 240) of a solution to find a suitable final design 260 to be printed by a three-dimensional printer 270. According to some embodiments, the generative process is based on algorithmic and parametric modeling and may be associated with a design schema, a means of creating variations, and a means of selecting desirable designs. According to some embodiments, genetic algorithms and/or random values may be used to help create variations. The generative design process 250 might be implemented, for example, using a programming environments (Processing, vvvv, Quartz Composer, Open Frameworks, etc.) or scripting capabilities (Grasshopper 3D in Rhinoceros 3D, Scriptographer, Sverchok for Blender, etc.).

The overall process 200 may be considered a model-enabled "sculpting" system where a designer starts off with the seed shape 210 and sculpts the final design 260 by adding constraints and loads periodically and the system interactively "predicts" potential designs based on deep learning models. Such an approach may substantially improve how quickly the design process can be performed.

The approach may also provide designs that leverage ideas from different domains (including those that might not be known to a particular designer). That is, a novice designer may leverage the expertise of advanced designers through the use of generative models. Note that an important part of making a computational model generative is a feedback loop. The feedback might, for example, range from simple mechanisms (where the model takes its own output for input) to relatively complex approaches (e.g., incorporating design evaluation routines). Generative methods may have roots deep within system dynamics modelling and are, by nature, repetitive processes where the solution is developed through several iterations of design operations.

Figure 3:
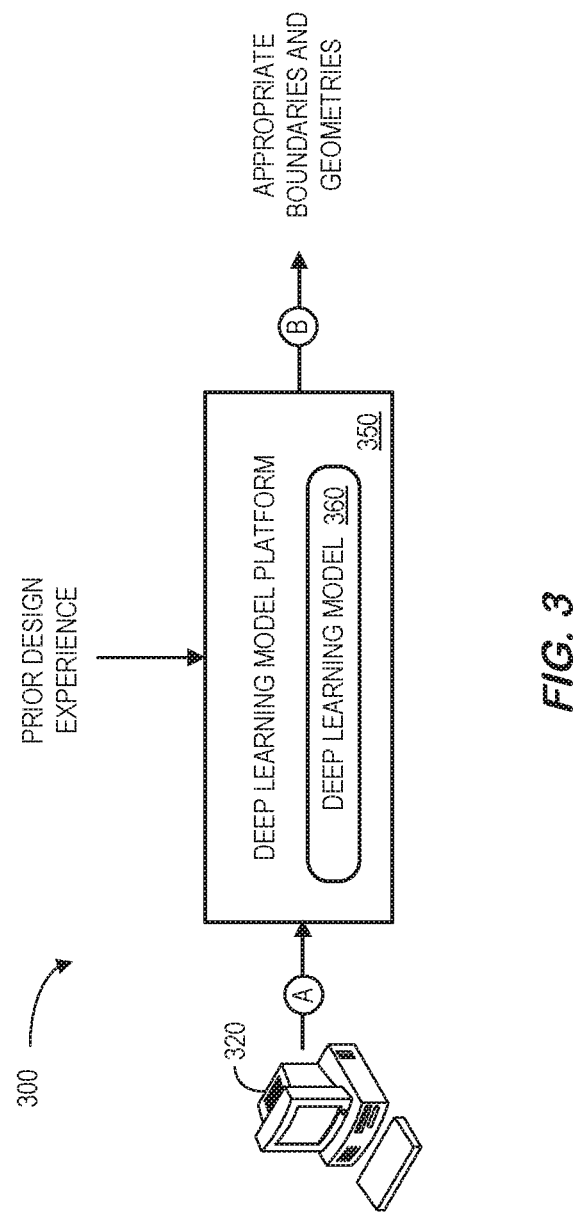
FIG. 3 is a high-level diagram of a generative design system according to some embodiments.

FIG. 3 is a high-level diagram of a generative design system 300 according to some embodiments. The system includes a deep learning model platform 350 that executes a deep learning model 360. According to some embodiments, the deep learning model platform 350 can access prior design experience (e.g., other industrial asset item designs) and receives design information from a design device 320. Note that the deep learning model platform 350 could be completely de-centralized and/or might be associated with a third party, such as a vendor that performs a service for an enterprise.

The deep learning model platform 350, designer device 320, and/or other elements of the system might be, for example, associated with a Personal Computer ("PC"), laptop computer, a tablet computer, a smartphone, an enterprise server, a server farm, and/or a database or similar storage devices. According to some embodiments, an "automated" deep learning model platform 350 may automatically provide a service via the designer device 320. As used herein, the term "automated" may refer to, for example, actions that can be performed with little (or no) intervention by a human.

As used herein, devices, including those associated with the deep learning model platform 350 and any other device described herein, may exchange information via any communication network which may be one or more of a Local Area Network ("LAN"), a Metropolitan Area Network ("MAN"), a Wide Area Network ("WAN"), a proprietary network, a Public Switched Telephone Network ("PSTN"), a Wireless Application Protocol ("WAP") network, a Bluetooth network, a wireless LAN network, and/or an Internet Protocol ("IP") network such as the Internet, an intranet, or an extranet. Note that any devices described herein may communicate via one or more such communication networks.

The deep learning model platform 350 may store information into and/or retrieve information from data stores. The data stores might, for example, store electronic records representing prior item designs, three-dimensional printer information, etc. The data stores may be locally stored or reside remote from the deep learning model platform 350. Although a single deep learning model platform 350 is shown in FIG. 3, any number of such devices may be included. Moreover, various devices described herein might be combined according to embodiments of the present invention. For example, in some embodiments, the deep learning model platform 350, designer device 302, and/or other devices might be co-located and/or may comprise a single apparatus.

In this way, the system 300 may efficiently and accurately facilitate creation of an industrial asset item. For example, at (A) the additive manufacturing platform 360 may receive design information (e.g., a selection of a starting seed shape, answers to questions, adjustments to various intermediate design proposals, etc.) to be used by the deep learning model 360. The deep learning model 360 may use the information to generate appropriate boundaries and geometries of a final design at (B). According to some embodiments, the deep learning model platform 350 may transmit the appropriate boundaries and geometries to an additive manufacturing platforms (e.g., by transmitting a definition file to the platform). The additive manufacturing platform can then communicate with the three-dimensional printer to initiate a printing process.

Figure 4:
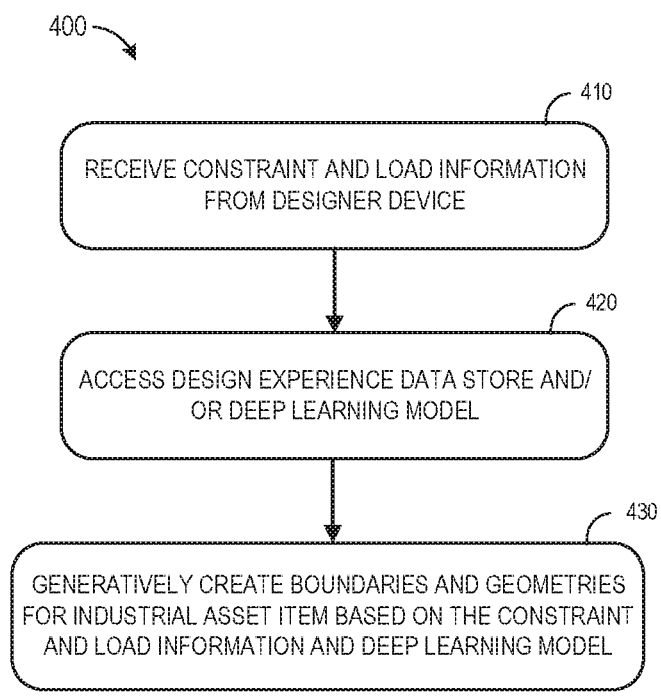
FIG. 4 is a method that may be associated with a generative design system in accordance with some embodiments.

Note that the system 300 of FIG. 3 is provided only as an example, and embodiments may be associated with additional elements or components. According to some embodiments, the elements of the system 300 automatically facilitate a design of an industrial asset item. For example, FIG. 4 illustrates a method 400 that might be performed according to some embodiments of the present invention. The flow charts described herein do not imply a fixed order to the steps, and embodiments of the present invention may be practiced in any order that is practicable. Note that any of the methods described herein may be performed by hardware, software, or any combination of these approaches. For example, a computer-readable storage medium may store thereon instructions that when executed by a machine result in performance according to any of the embodiments described herein.

At 410, a deep learning model platform may receive constraint and load information from a designer device. At 420, the deep learning model platform may access a design experience data store containing electronic records associated with prior industrial asset item designs. The deep learning model platform may also access a deep learning model associated with an additive manufacturing process (e.g., a model that implements a generative design process). At 430, the deep learning model platform may generatively create boundaries and geometries for the industrial asset item based on the prior industrial asset item designs and the received constraint and load information.

As used herein, the phrase "additive manufacturing" may refer to various types of three-dimensional printing, including, for example, those described in the American Society for Testing and Materials ("ASTM") group "ASTM F42—Additive Manufacturing" standards. These include vat photopolymerisation (using a vat of liquid photopolymer resin), material jetting (where material is jetted onto a build platform), binder jetting (e.g., using a powder based material and a binder), material extrusion such as Fuse Deposition Modelling ("FDM"). powder bed fusion (e.g., Direct Metal Laser Sintering ("DMLS"), Electron Beam Melting ("EBM"), etc.), a sheet lamination (including Ultrasonic Additive Manufacturing ("UAM") and Laminated Object Manufacturing ("LOM")), and Directed Energy Deposition ("DED").

Figure 5:
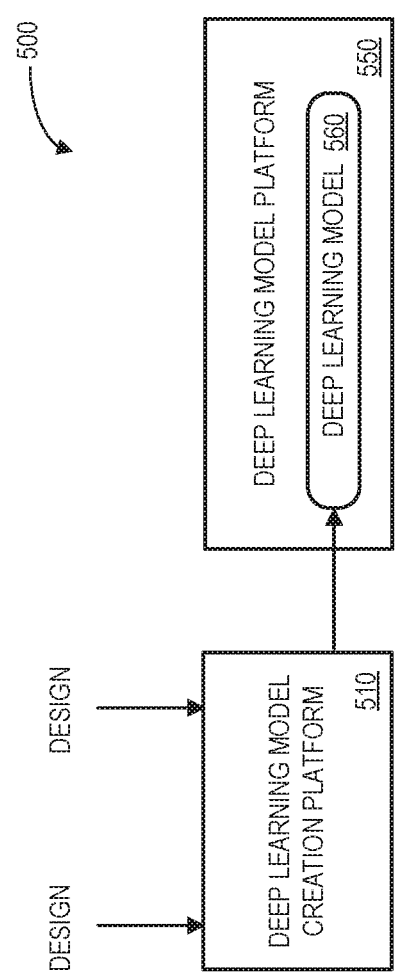
FIG. 5 is a high-level diagram of a deep learning model creation system according to some embodiments.

Note that a deep learning model might be created in a number of different ways. For example, FIG. 5 is a high-level diagram of a deep learning model creation system 500 according to some embodiments. The system includes a deep learning model platform 550 and a deep learning model creation platform 510 that has access to a number of prior industrial asset item designs. The deep learning model creation platform 510 may use these various designs to automatically generate a deep learning model 560 (e.g., using a neural network machine algorithm having one or more hidden layers) that can then be provided to the deep learning model platform 550.

Figure 6:
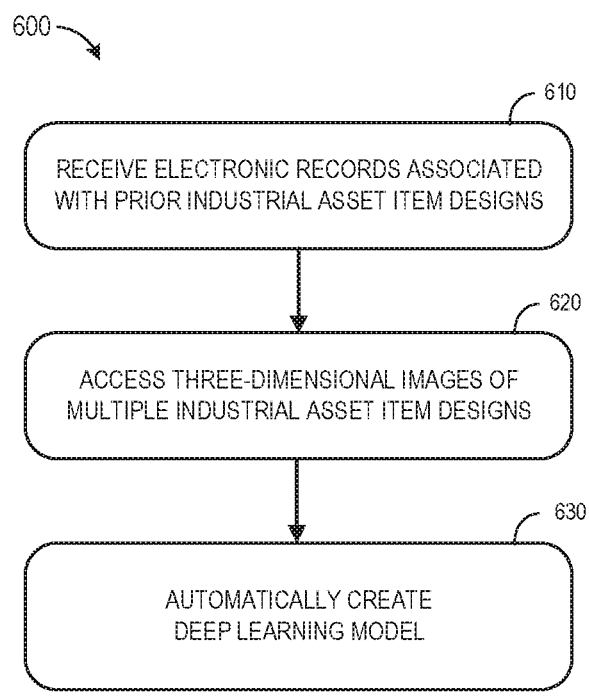
FIG. 6 is a deep learning model creation method in accordance with some embodiments.

FIG. 6 is a deep learning model creation method 600 in accordance with some embodiments. At 610, a deep learning model creation platform may receive electronic records associated with the prior industrial asset item designs. At 5620, the deep learning model creation computer may access three-dimensional images of multiple industrial asset designs. Note that these images might be associated with different types of assets as compared to the one currently being designed. At 5630, the deep learning model creation platform may automatically create a deep learning model using the three-dimensional images of multiple industrial asset item designs.

Figure 7:
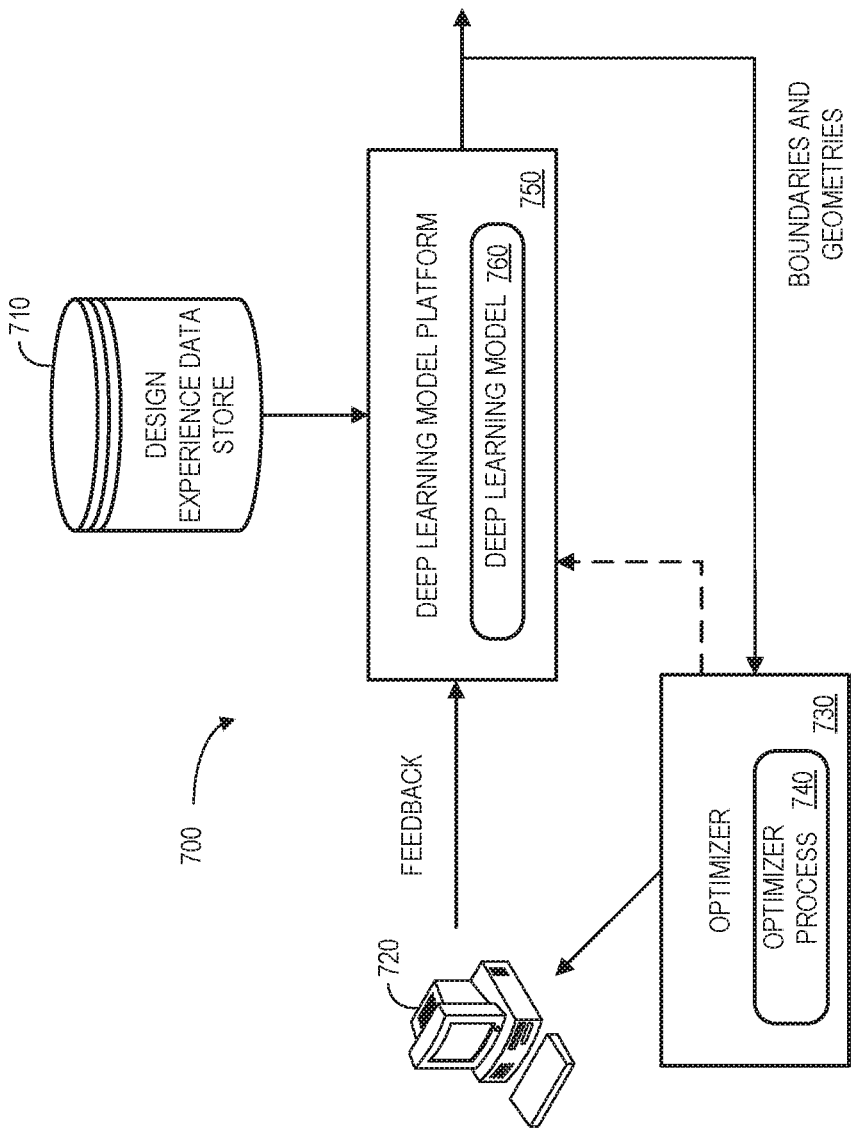
FIG. 7 is a high-level diagram of a design optimization system according to some embodiments.

In some cases, feedback from a designer might be used to facilitate the item design process. For example, FIG. 7 is a high-level diagram of a design optimization system 700 according to some embodiments. As before, the system 700 includes a deep learning model platform 750 that can access a design experience data store 710 and can execute a deep learning model 760. In this case, the boundaries and geometries generated by the deep learning model platform may be provided to an optimizer 730 executing an optimizer process 740. The results of the optimizer process 740 might be directly fed back to the deep learning model platform 750 (as illustrated by the dashed arrow in FIG. 7) or via a designer device 720 (e.g., after receiving one or more adjustments from a designer and/or an indication of the validity of the predicted design).

Figure 8:
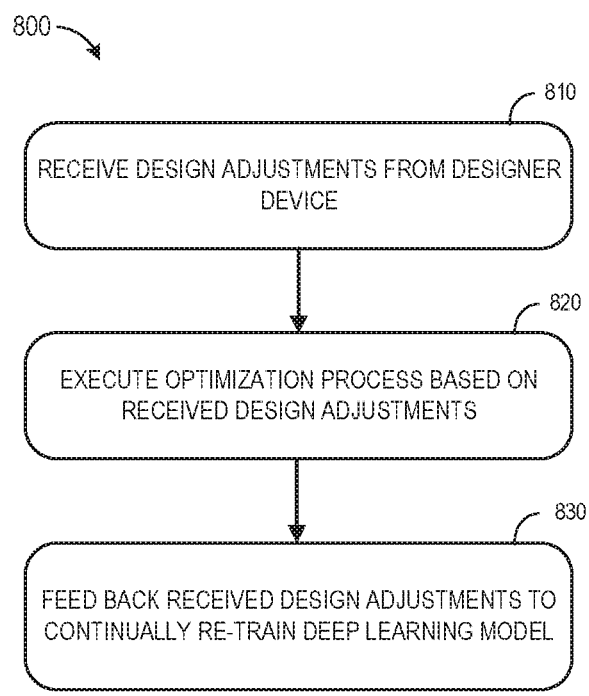
FIG. 8 is a design optimization method in accordance with some embodiments.

FIG. 8 is a design optimization method 800 in accordance with some embodiments. At 810, design adjustments may be received from a designer device. For example, the designer might alter a suggest shape, add or delete an element, indicate "approval" or "disapproval" of the intermediate design (is the design evolving in an appropriate direction), etc. At 820, an optimization process may be executed based on the received design adjustments. For example, a deep learning model computer processor may receive design adjustments from the designer device and, based on the received design adjustments, execute an optimization process. At 830, the received design adjustments may be fed back to continually re-train the deep learning model.

Figure 9:
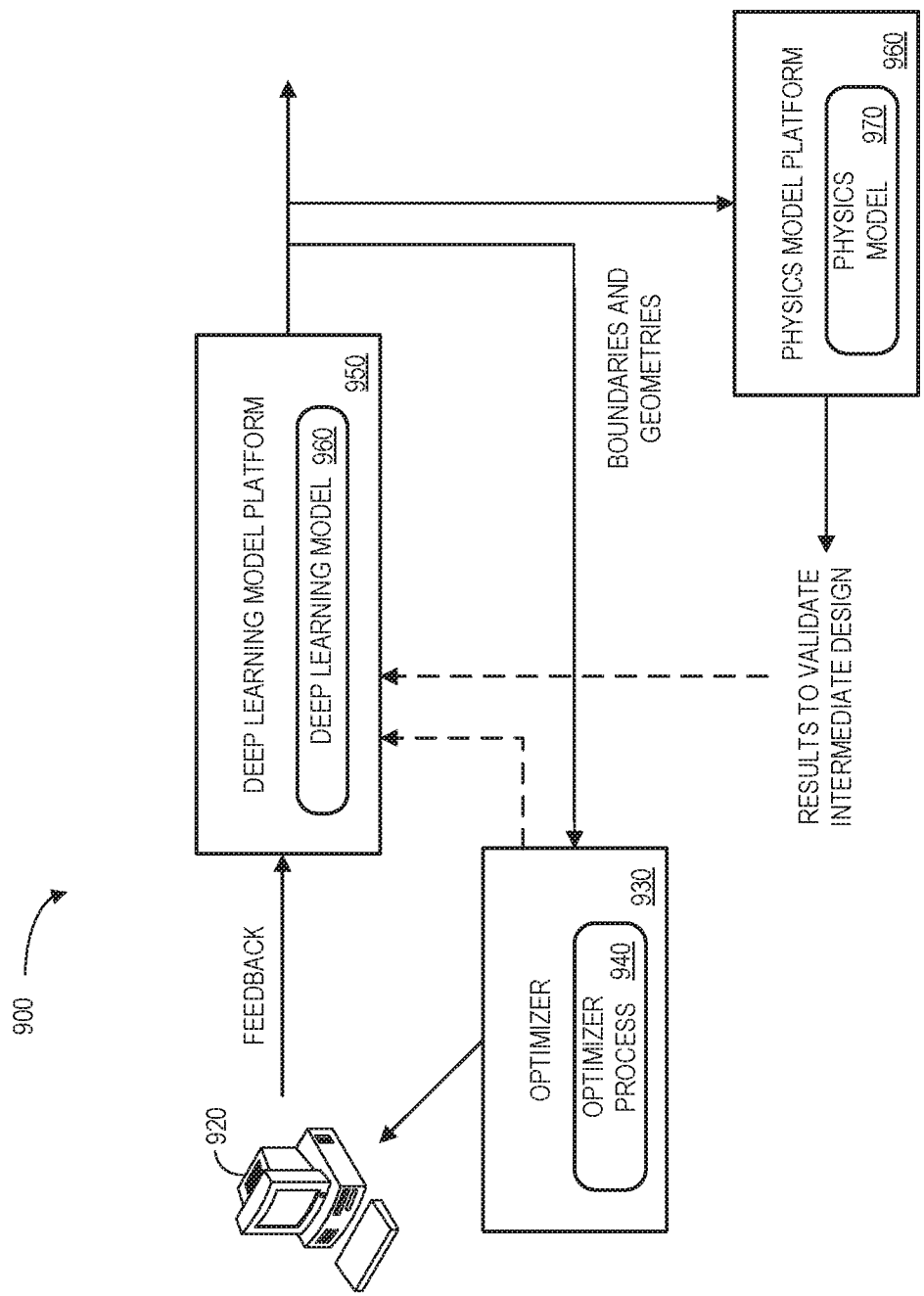
FIG. 9 is a high-level diagram of a system including a physics model according to some embodiments.

FIG. 9 is a high-level diagram of a system 900 including a physics model according to some embodiments. As before, the system 900 includes a deep learning model platform 950 that can execute a deep learning model 960. In this case, the boundaries and geometries generated by the deep learning model platform may be provided to an optimizer 930 executing an optimizer process 940 and a physics model platform 960 executing a physics model 970. The results of the optimizer process 940 might be directly fed back to the deep learning model platform 950 (as illustrated by the dashed arrow in FIG. 9) or via a designer device 920 (e.g., after receiving one or more adjustments from a designer and/or an indication of the validity of the predicted design). Results from the physics model platform 960 may also be fed back to the deep learning model platform 950 to validate intermediate designs.

Figure 10:
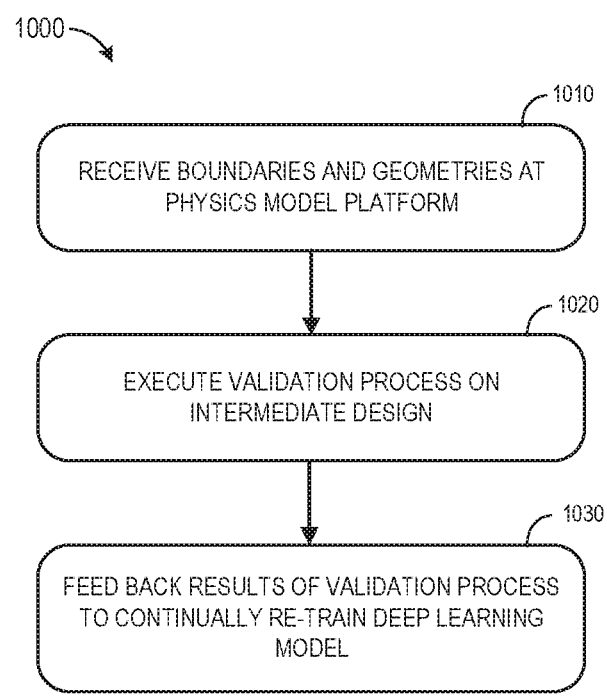
FIG. 10 is a method that may be associated with a system having a physics model in accordance with some embodiments.

FIG. 10 is a method 1000 that may be associated with a system having a physics model in accordance with some embodiments. At 1010, boundaries and geometries may be received at a physics model platform. At 1020, the physics model platform may execute a validation process on at least one intermediate industrial asset design (e.g., does the physics model indicate that the design is behaving as it is supposed to behave?). According to some embodiments, the validation process might be associated with a high-fidelity physics model, the Ansys®/LS_Dyna model, etc. At 1030, the results of the validation process may be fed back to continually re-train the deep learning model.

Figure 11:
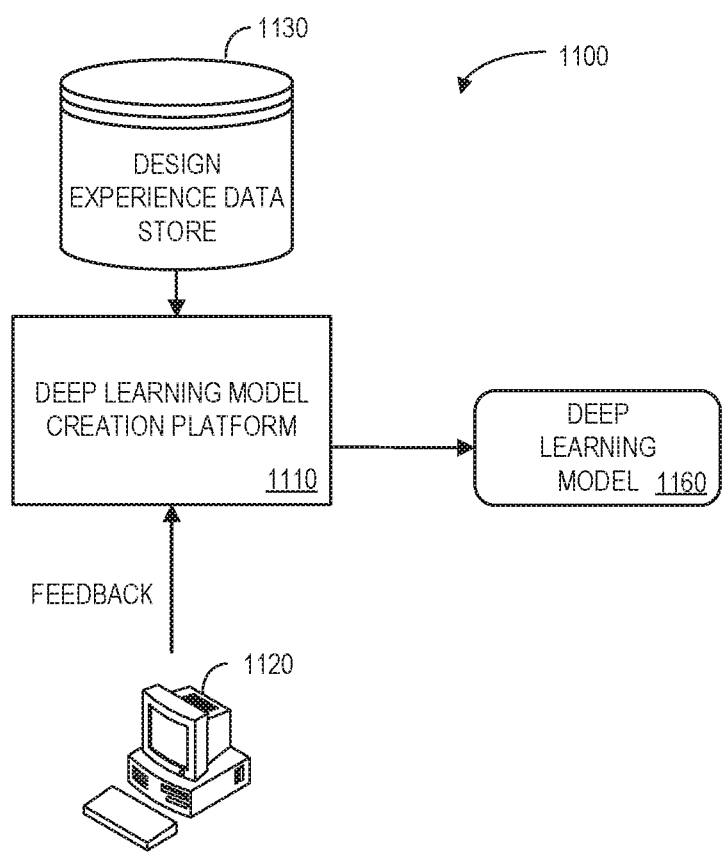
FIG. 11 is a high-level diagram of a system for fine tuning a deep learning model according to some embodiments.
Figure 12:
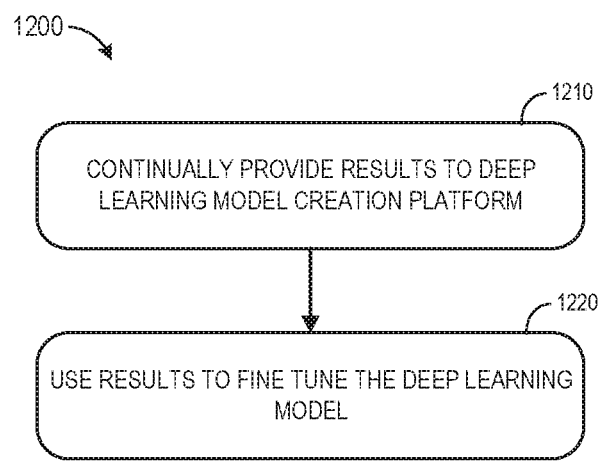
FIG. 12 is a method for fine tuning a deep learning model in accordance with some embodiments.

FIG. 11 is a high-level diagram of a system 1100 for fine tuning a deep learning model according to some embodiments. According to this embodiment, a deep learning model creation platform 1110 can access a design experience data store 1130 (e.g., containing past item design). Moreover, the deep learning model creation platform receives feedback from a designer device 1120 that can be used to fine-tine the current dep learning model 1160 and/or future deep learning models. FIG. 12 is a method 1200 for fine tuning a deep learning model in accordance with some embodiments. At 1210, the system may continually provide results to a deep learning model creation platform. At 1220, the system may use those results to fine tune at least one deep learning model.

Figure 13:
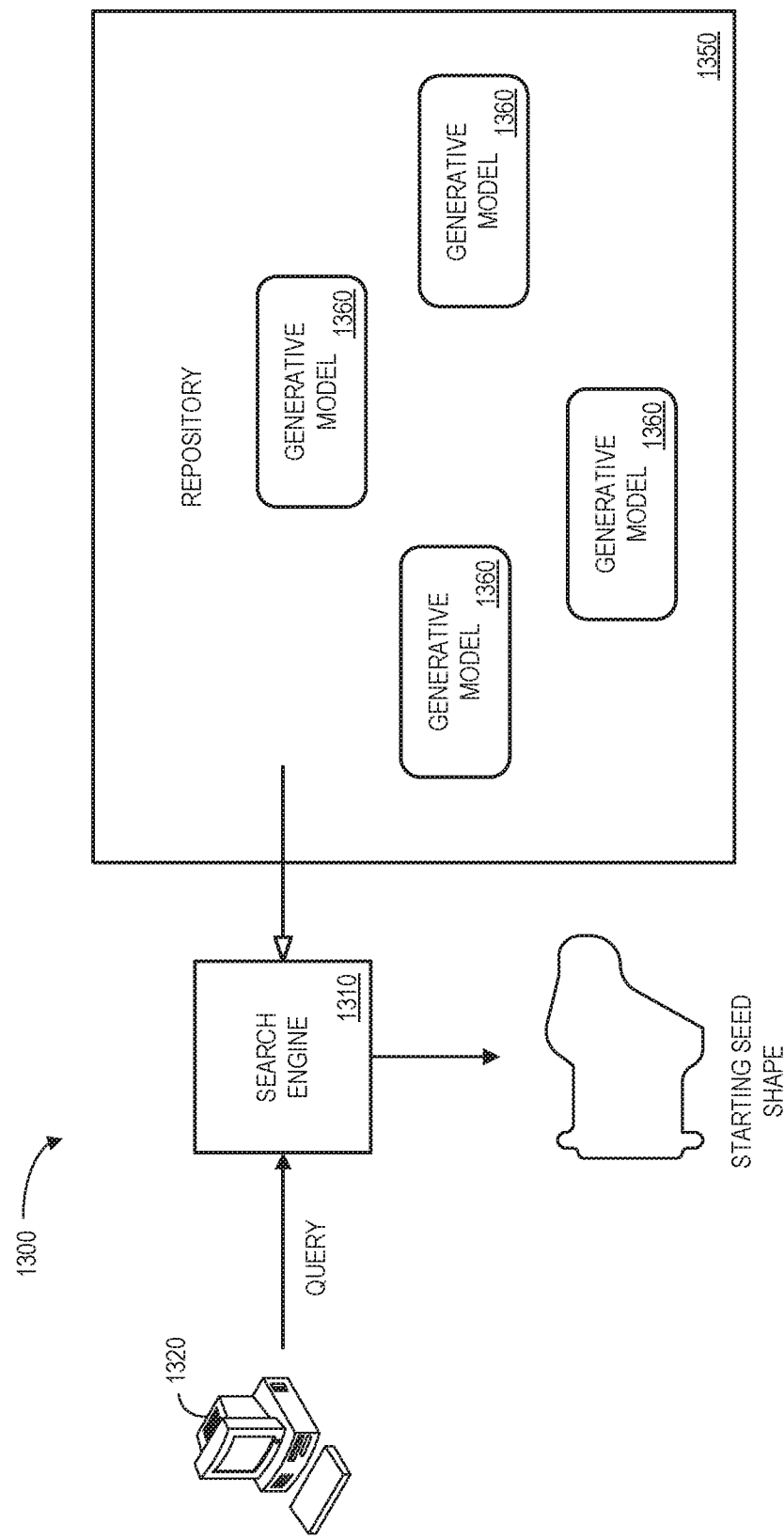
FIG. 13 is a high-level diagram of a generative model system according to some embodiments.
Figure 14:
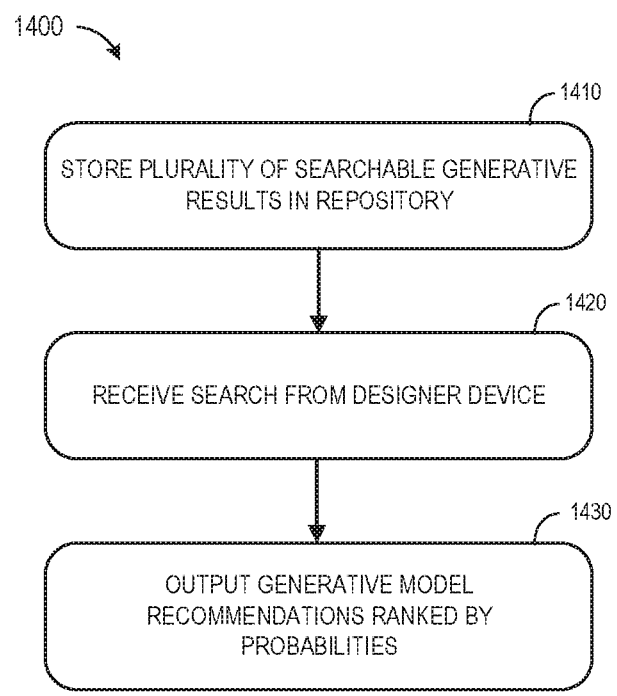
FIG. 14 is a method that may be associated with a generative model system in accordance with some embodiments.

In this way, over time, the generative models may become a repository of institutional knowledge that can be constantly mined for rapid design innovations. FIG. 13 is a high-level diagram of a generative model system 1300 according to some embodiments. In this case, a repository 1350 stores many different generative models 1360 (e.g., associated with different types of asset items). A search engine 1310 may receive a query from a designer device 1320 and use that query to select and appropriate generative model 1360 and/or a starting seed shape for a new project. For example, the search engine 1310 might select the generative model 1360 that most closely matches a designer's requirements. FIG. 14 is a method 1300 that may be associated with a generative model system in accordance with some embodiments. At 1410, the system may curate a repository storing a plurality of searchable generative models. At 1420, a designer can perform an automated search of the repository being providing the search requirements from a designer device. At 1420, the system may output generative model recommendations ranked by probabilities (e.g., with the most likely appropriate model and/or starting seed shape appearing at the top of a search results list).

Figure 15:
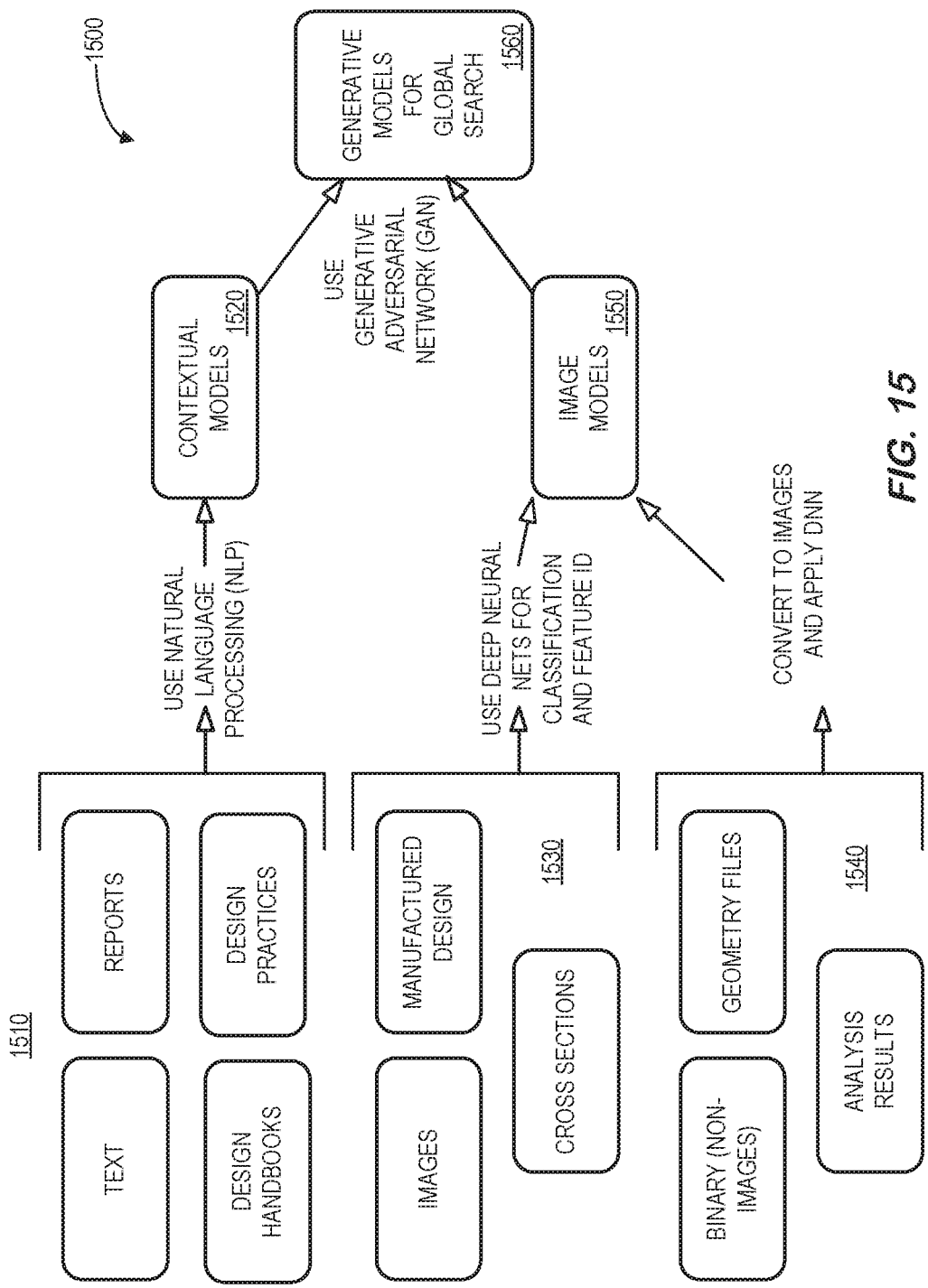
FIG. 15 illustrates a generative design process to build generative models according to some embodiments.

FIG. 15 illustrates a generative design process 1500 to build generative models according to some embodiments. In this example, automatically and generatively created boundaries and geometries are associated with a generative model for an industrial asset item. Moreover, the generative model 1560 may be created by a Generative Adversarial Network ("GAN") based on at least one contextual model 1520 or at least one image model 1550. Note that the generative model might be associated with many different types of models, including, for example, a Gaussian mixture model, a hidden Markov model, probabilistic context-free grammar, a naive Bayes model, averaged one-dependence estimators, latent Dirichlet allocation, a restricted Boltzmann machine, a GAN, etc.

As one example, a contextual model 1520 might be based on natural language processing of text, reports, design handbooks, and design practices 1510. As another example, an image model might be based on classification and feature identification performed by a Deep Neural Network ("DNN") in connection with an image, a manufactured design, a cross-section 1530, a binary Computer Aided Design ("CAD") file, a geometry file, analysis results 1540 (after conversion to images and application of a DNN), etc.

Figure 16:
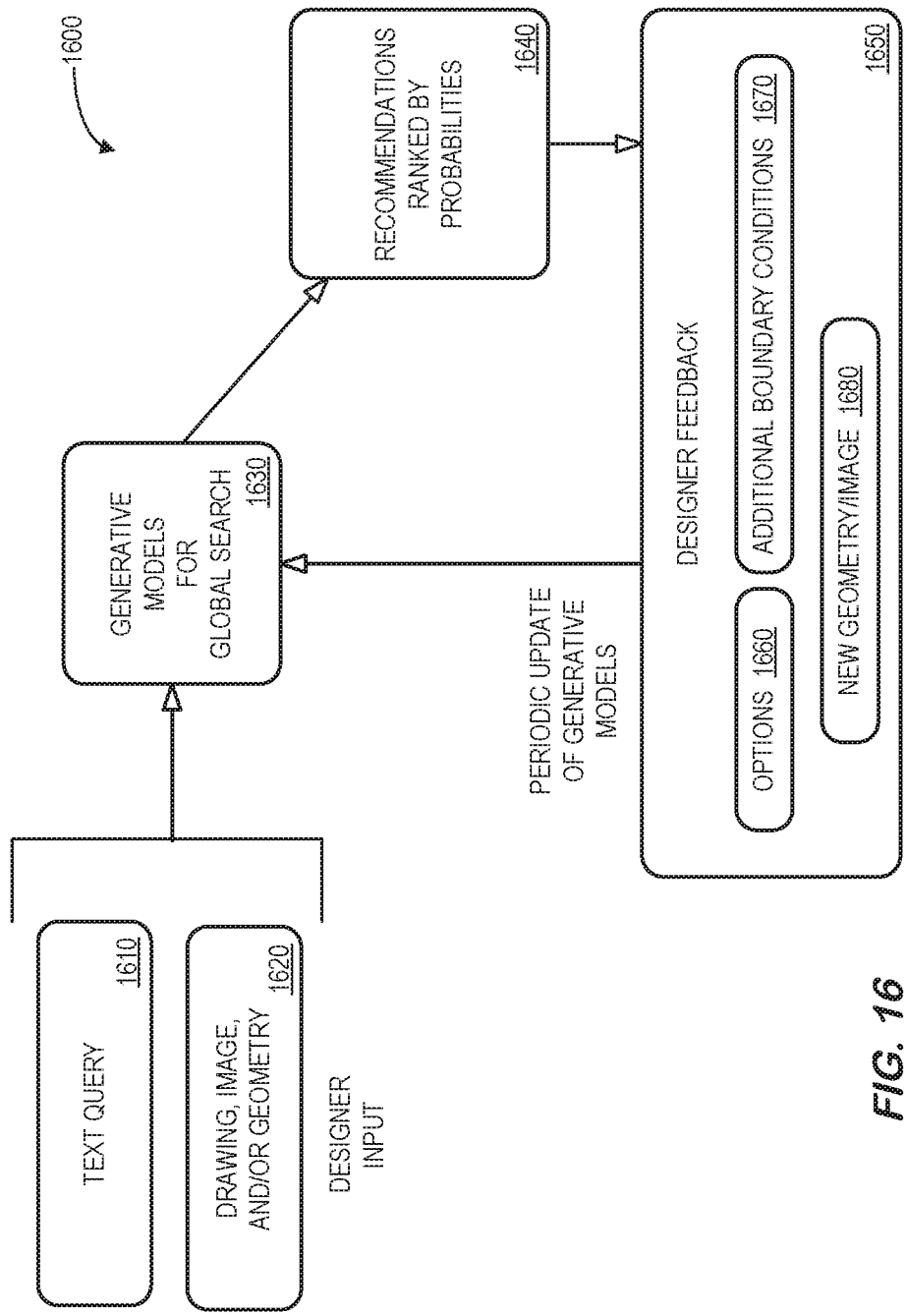
FIG. 16 illustrates a generative design process to optimize generative models in accordance with some embodiments.

FIG. 16 illustrates a generative design process 1600 to optimize generative models in accordance with some embodiments. In this example, designer input, such as a text query and/or drawing/image/geometry may be provided to a set of generative models for global search 1630. The global search generates recommendations ranked by probabilities 1640 that are exposed to designer feedback, such as options 1660, additional boundary conditions 1670, a new geometry and/or image 168, etc. The designer feedback may provide a periodic update of the generative models 1630.

Thus, embodiments may provide a framework for designing structures through a combination of deep learning models and design expertise through generative techniques. Embodiments may provide an accelerated process for design using a search engine. Imagine, for example, a system that can quickly "search" or predict potential designs based on a few simple "questions" or boundaries the designer provides and then continually adjust results based on additional boundary conditions/feedback provided by the designer. Such a system may help a designer identify concepts that he or she was not be aware of and leverages the collective wisdom of all designs that have been codified in the system. Moreover, embodiments may provide the capability to generate new designs that are a combination of multiple prior, independent designs. This may open up totally new concepts that might not be possible with either the system alone or the designer alone.

Some embodiments may be implemented as a two-step process. The first step may be to build a deep learning model (or models) that incorporate design information. This may be done by using a combination of reports (text mining, natural language processing), images (both real world and computer generated) of design geometries and cross sections along with intended use and geometry files. The deep learning model may take in boundary lines or search terms as inputs and produce outputs that are images or geometry. Note that this goes beyond a simple image search because it is not just based on the query but may also depend on the geometry that the design can "draw."

The second step may be to get a seed idea from the designer (like a geometry outline and a query) and may be augmented continually by the predictions from a deep learning model that has codified designs from a multitude of sources—including images of real, manufactured parts and geometries. The deep learning model may predict potential designs once the designer starts adding boundaries and constraints. As the designer continues to add more constraints (or reject a predicted design), the system continually adjusts the design/predictions. The system may also suggest multiple designs for the designer to select one, or to at least narrow down the options, as each new condition or criteria is added. For example, if the designer picks one option from many presented ones, the subsequent predictions may be tuned to the previous selections.

Figure 17:
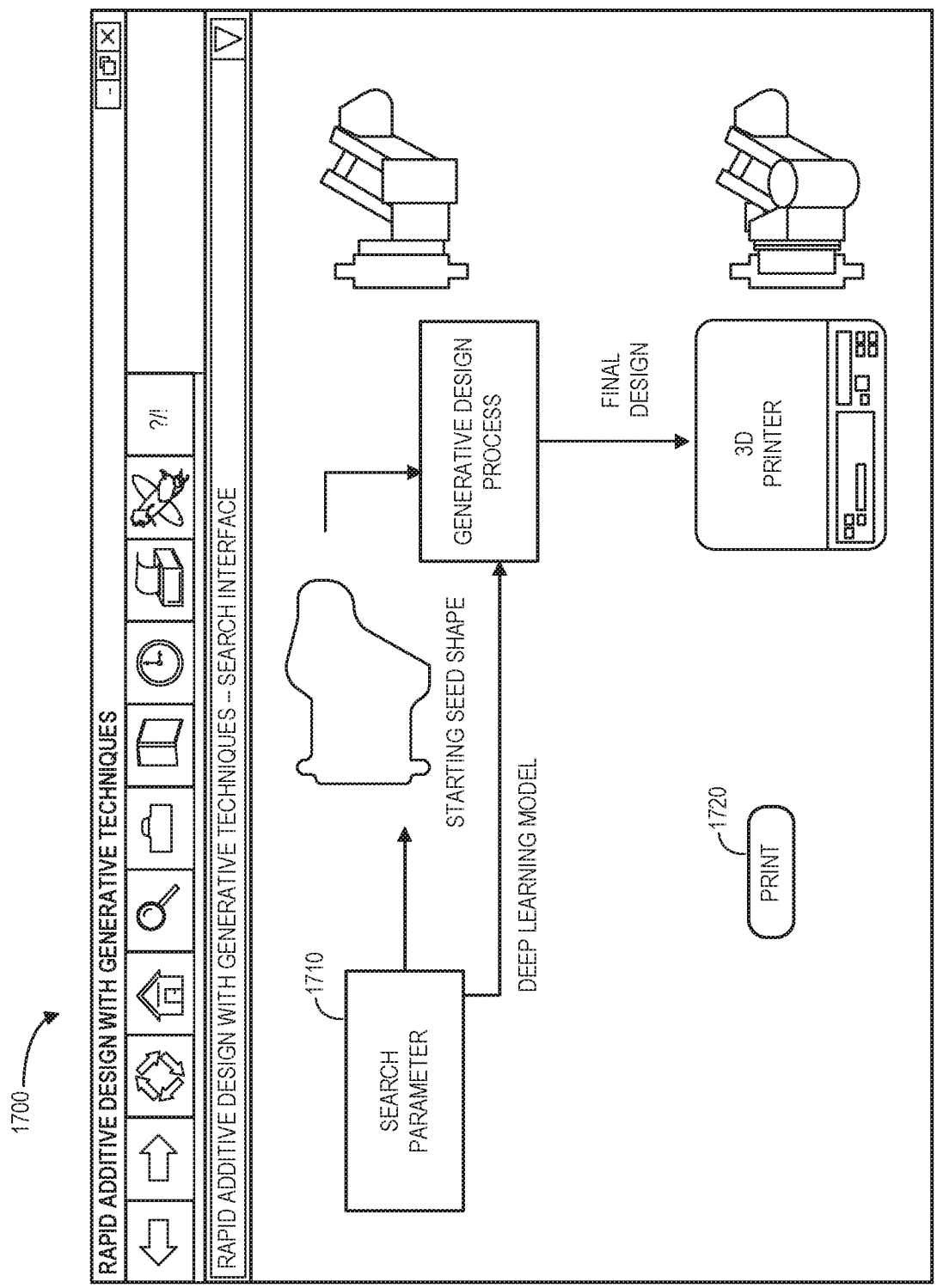
FIG. 17 illustrates an interactive search interface display in accordance with some embodiments.

FIG. 17 is an interactive user interface display 1700 that may be provided according to some embodiments. The display includes a search parameter entry portion 1710 where a designer can enter a word or phrase, drag and drop an image, etc. Responsive to the search parameter, the system may select a starting seed shape execute a generative design proves. Once the design is complete to the designer's satisfaction, an interactive "Print" icon 1720 may be selected (e.g., via touchscreen or activation via computer mouse) to have the item printed by a three-dimensional printer.

Figure 18:
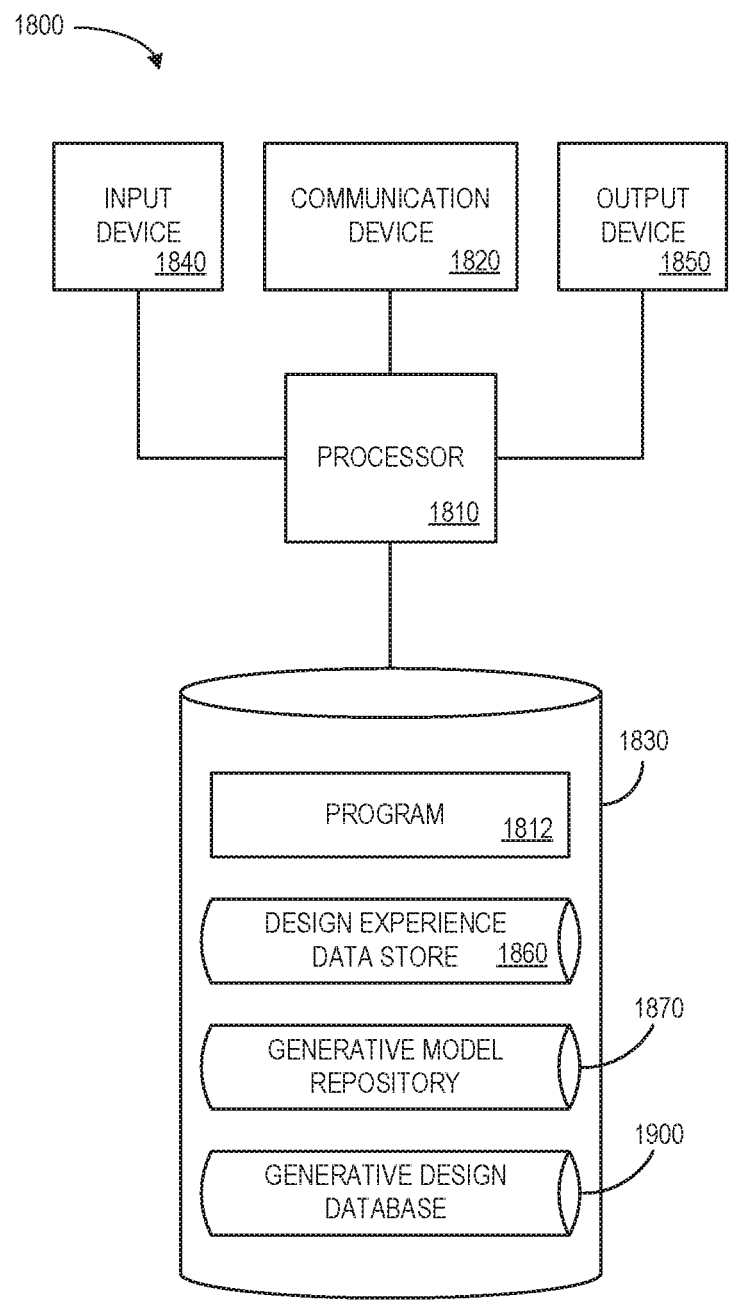
FIG. 18 illustrates a platform according to some embodiments.

Embodiments described herein may comprise a tool that facilitates design of an industrial asset item and may be implemented using any number of different hardware configurations. For example, FIG. 18 illustrates a platform 1800 that may be, for example, associated with the system 300 of FIG. 3 (as well as other systems described herein). The platform 1800 comprises a processor 1810, such as one or more commercially available Central Processing Units ("CPUs") in the form of one-chip microprocessors, coupled to a communication device 1820 configured to communicate via a communication network (not shown in FIG. 18). The communication device 1820 may be used to communicate, for example, with one or more remote designer devices. Note that communications exchanged via the communication device 1820 may utilize security features, such as those between a public internet user and an internal network of an insurance enterprise. The security features might be associated with, for example, web servers, firewalls, and/or PCI infrastructure. The platform 1800 further includes an input device 1840 (e.g., a mouse and/or keyboard to enter information about a design file, an industrial asset item, etc.) and an output device 1850 (e.g., to output design reports, generate production status messages, etc.).

The processor 1810 also communicates with a storage device 1830. The storage device 1830 may comprise any appropriate information storage device, including combinations of magnetic storage devices (e.g., a hard disk drive), optical storage devices, mobile telephones, and/or semiconductor memory devices. The storage device 1830 stores a program 1812 and/or network security service tool or application for controlling the processor 1810. The processor 1810 performs instructions of the program 1812, and thereby operates in accordance with any of the embodiments described herein. For example, the processor 1810 may access a design experience data store 1860 containing electronic records associated with prior industrial asset item designs. The processor 1810 may then receive constraint and load information from a designer device and generatively create boundaries and geometries, using a deep learning model associated with an additive manufacturing process, for an industrial asset item based on the prior industrial asset item designs and the received constraint and load information.

The program 1812 may be stored in a compressed, uncompiled and/or encrypted format. The program 1812 may furthermore include other program elements, such as an operating system, a database management system, and/or device drivers used by the processor 1810 to interface with peripheral devices.

As used herein, information may be "received" by or "transmitted" to, for example: (i) the platform 1800 from another device; or (ii) a software application or module within the platform 1800 from another software application, module, or any other source.

In some embodiments (such as shown in FIG. 18), the storage device 1830 further stores the design experience data store 1860, a generative model repository 1870, and a generative design database 1900. An example of a database that might be used in connection with the platform 1800 will now be described in detail with respect to FIG. 19. Note that the database described herein is only an example, and additional and/or different information may be stored therein. Moreover, various databases might be split or combined in accordance with any of the embodiments described herein. For example, the design experience database 1860 and/or generative model repository 1900 might be combined and/or linked to each other within the program 1812.

Referring to FIG. 19, a table is shown that represents the generative design database 1900 that may be stored at the platform 1800 in accordance with some embodiments. The table may include, for example, entries identifying designs that have been created for industrial asset items. The table may also define fields 1902, 1904, 1906, 1908, 1910, 1912, 1914 for each of the entries. The fields 1902, 1904, 1906, 1908, 1910, 1912, 1914 may, according to some embodiments, specify: a design identifier 1902, a designer identifier 1904, an item description 1906, a selected deep learning model 1908, a seed shape 1910, a final design 1912, and a status 1914. The generative design database 1900 may be created and updated, for example, based on information electrically received from remote designer devices, additive manufacturer platforms, etc.

The design identifier 1902 may be, for example, a unique alphanumeric code identifying a design that is being or has been created for an industrial asset item. The designer identifier 1904 might indicate who created the design, and the item description 1906 might describe the item (e.g., what the item is, what asset it belongs to, etc.). The selected deep learning model 1908 might identify the generative model that was used to iteratively created the design for the item, and the seed shape 1910 might represent an initial or "starting off point" for the design. The final design 1912 might comprise, for example, a print file, an image, etc. that represents the final industrial asset item design. The status 1914 might indicate, for example, that the design is "pending," "in process," "printed," etc.

Thus, some embodiments described herein may provide technical advantages, such as an ability to design three-dimensional printed parts beyond the current capability of designers, faster design cycle times, design that leverage the knowledge from multiple sources and hence might be inherently globally optimal (rather than locally optimized), etc. Embodiments may also provide commercial advantages, such as a reduction in design and/or manufacturing costs, a reduction in manufacturing time for additive printing of large parts, designs that are less expensive and more efficient, etc.

The following illustrates various additional embodiments of the invention. These do not constitute a definition of all possible embodiments, and those skilled in the art will understand that the present invention is applicable to many other embodiments. Further, although the following embodiments are briefly described for clarity, those skilled in the art will understand how to make any changes, if necessary, to the above-described apparatus and methods to accommodate these and other embodiments and applications.

Figure 20:
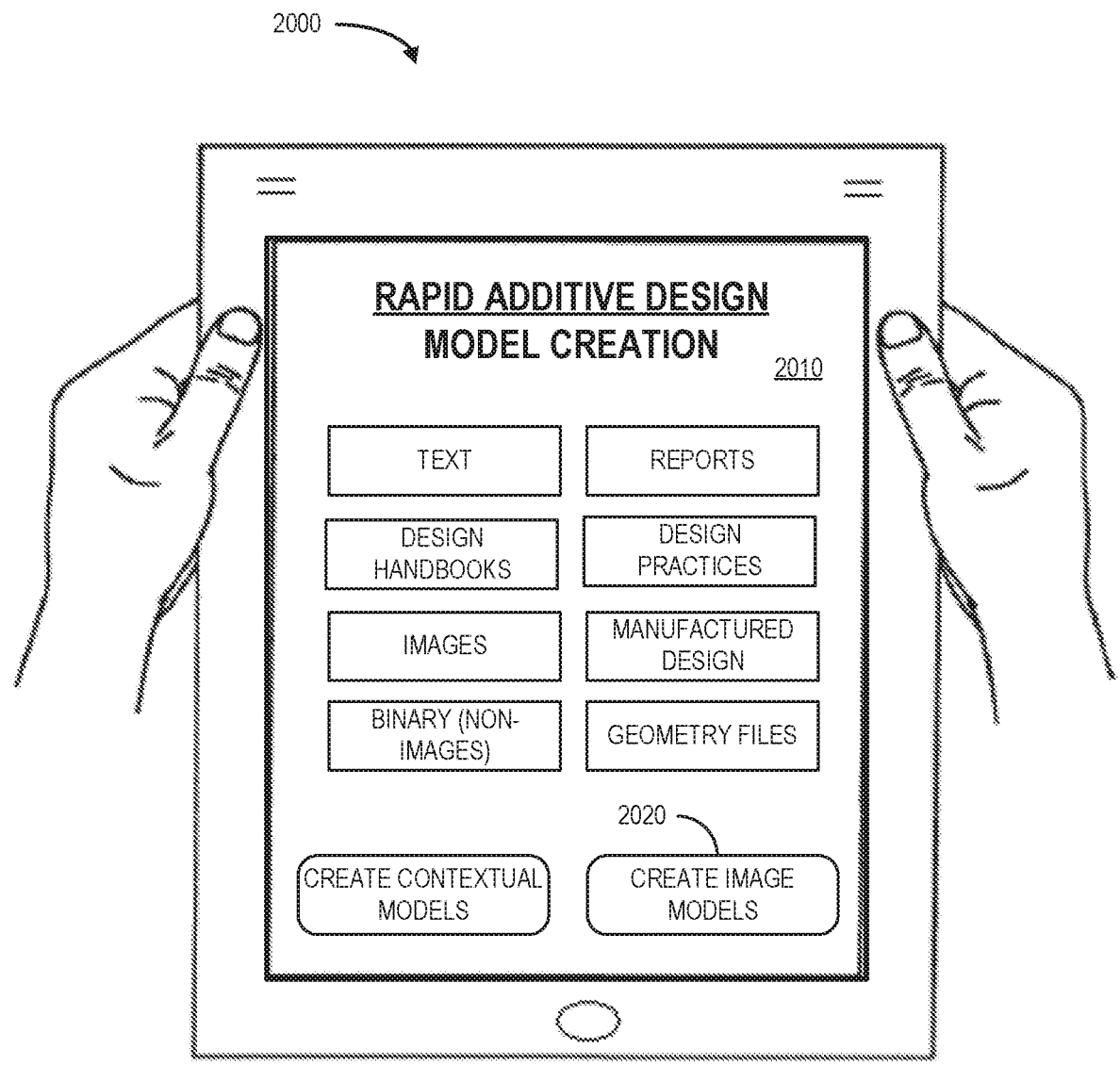
FIG. 20 illustrates a tablet computer providing a display according to some embodiments.

Although specific hardware and data configurations have been described herein, note that any number of other configurations may be provided in accordance with embodiments of the present invention (e.g., some of the information described herein may be combined or stored in external systems). Moreover, although embodiments have been described with respect to industrial systems, note that embodiments might be associated with other types of computing systems, including non-industrial systems and processors in general. Similarly, the displays shown and described herein are provided only as examples, and other types of displays and display devices may support any of the embodiments. For example, FIG. 20 illustrates a tablet computer 2000 with an interactive rapid additive design display 2010 that might utilize a graphical user interface. The display 2010 might comprise an overview of source material that can be used to create models. Note that selection of an element on the display 2010 might result in a display of further information about that element. Moreover, the display 2010 might an interactive user interface (e.g., via a touchscreen) and includes create model 2020 icons (for contextual and image models) in accordance with any of the embodiments described herein.

Some embodiments have been described with respect to the creation of an "industrial asset item," which might be, for example, an engine part, a generator component, etc. Note, however, that as used herein the phrase "industrial asset item" might refer to any other type of item, including:

consumer electronics, toys, household goods, automotive parts, etc. In general, embodiments may address the challenge in additive manufacturing where geometries are inherently complex and may be impractical to derive through traditional tools or processes. In addition to additive manufacturing, general design exploration may also be enhanced by the collective wisdom that is codified in the deep learning models as described herein.

The present invention has been described in terms of several embodiments solely for the purpose of illustration. Persons skilled in the art will recognize from this description that the invention is not limited to the embodiments described, but may be practiced with modifications and alterations limited only by the spirit and scope of the appended claims.

The invention claimed is:

1. A system to facilitate creation of an industrial asset item, comprising:
   a design experience data store containing electronic records associated with prior industrial asset item designs; and
   a deep learning model platform, coupled to the design experience data store, including:
   a communication port to receive constraint and load information from a designer device, and
   a deep learning model computer processor coupled to the communication port and adapted to automatically and generatively create boundaries and geometries, using a deep learning model associated with an additive manufacturing process, for the industrial asset item based on the prior industrial asset item designs and the received constraint and load information, wherein the automatically and generatively created boundaries and geometries are associated with a generative model for the industrial asset item.

2. The system of claim 1, further comprising:
   a deep learning model creation platform to receive the electronic records associated with the prior industrial asset item designs and to automatically create the deep learning model using three-dimensional images of multiple industrial asset item designs.

3. The system of claim 1, wherein the deep learning model computer processor is further to receive design adjustments from the designer device and, based on the received design adjustments, execute an optimization process.

4. The system of claim 3, wherein the received design adjustments are fed back to continually re-train the deep learning model.

5. The system of claim 1, further comprising:
   a physics model platform to receive the boundaries and geometries and execute a validation process on at least one intermediate industrial asset design.

6. The system of claim 5, wherein results of the validation process are fed back to continually re-train the deep learning model.

7. The system of claim 1, further comprising:
   a repository storing a plurality of searchable generative models.

8. The system of claim 7, wherein a designer can perform an automated search of the repository.

9. The system of claim 8, wherein results of said search comprise generative model recommendations ranked by probabilities.

10. The system of claim 1, wherein the generative model is created by a Generative Adversarial Network ("GAN") based on at least one contextual model or at least one image model.

11. The system of claim 1, wherein the generative model is associated with at least one of: (i) a Gaussian mixture model, (ii) a hidden Markov model, (iii) probabilistic context-free grammar, (iv) a naive Bayes model, (v) averaged one-dependence estimators, (vi) latent Dirichlet allocation, (vii) a restricted Boltzmann machine, and (xiii) a generative adversarial network.

12. The system of claim 1, wherein the generative model is further created based on natural language processing of at least one of: (i) text, (ii) reports, (iii) design handbooks, and (iv) design practices.

13. The system of claim 12, wherein the natural language processing creates a contextual model.

14. The system of claim 1, wherein the generative model is further created based on classification and feature identification performed by a deep neural network in connection with at least one of: (i) an image, (ii) a manufactured design, (iii) a cross-section, (iv) a binary Computer Aided Design ("CAD") file, (v) a geometry file, and (vi) analysis results.

15. The system of claim 14, wherein the classification and feature identification creates an image model.

16. The system of claim 1, further comprising:
   an additive manufacturing printer, to receive a final industrial asset design based on the automatically and generatively created boundaries and geometries, wherein the printer associated with at least one of: (i) three-dimensional printing, (ii) vat photopolymerization, (iii) material jetting, (iv) binder jetting, (vi) material extrusion, (vii) powder bed fusion, (viii) sheet lamination, and (ix) directed energy deposition.

17. A computer-implemented method to facilitate creation of an industrial asset item, comprising:
   receiving, at a search platform from a designer device, a search of a generative model repository;
   executing a search of the generative model repository to identify a starting seed shape for the industrial asset item;
   receiving, at a deep learning model platform, the starting seed shape along with constraint and load information from the designer device;
   automatically and generatively creating boundaries and geometries, by the deep learning model platform using a deep learning model associated with an additive manufacturing process, for the industrial asset item based on the prior industrial asset item designs and the received constraint and load information;
   receiving design adjustments at the deep learning model platform from the designer device;
   executing an optimization process based on the received design adjustments, execute an optimization process;
   executing, at a physics model platform, a validation process on at least one intermediate industrial asset design based on received the boundaries and geometries;
   receiving, at an additive manufacturing printer, a final industrial asset design based on the automatically and generatively created boundaries and geometries; and
   creating, by the additive manufacturing printer, the industrial asset item.

18. The method of claim 17, wherein the automatically and generatively created boundaries and geometries are associated with a generative model for the industrial asset item.

19. The method of claim 18, wherein the generative model is created by a Generative Adversarial Network ("GAN") based on at least one contextual model or at least one image model.

20. The method of claim 19, wherein the generative model is associated with at least one of: (i) a Gaussian mixture model, (ii) a hidden Markov model, (iii) probabilistic context-free grammar, (iv) a naive Bayes model, (v) averaged one-dependence estimators, (vi) latent Dirichlet allocation, (vii) a restricted Boltzmann machine, and (xiii) a generative adversarial network.

21. The method of claim 20, wherein the generative model is further created based on a contextual model produced via natural language processing of at least one of: (i) text, (ii) reports, (iii) design handbooks, and (iv) design practices.

22. The method of claim 20, wherein the generative model is further created based on an image model produced via classification and feature identification performed by a deep neural network in connection with at least one of: (i) an image, (ii) a manufactured design, (iii) a cross-section, (iv) a binary Computer Aided Design ("CAD") file, (v) a geometry file, and (vi) analysis results.

\* \* \* \* \*